(12) United States Patent
Jin et al.

(10) Patent No.: US 9,006,967 B2
(45) Date of Patent: Apr. 14, 2015

(54) ORGANIC LIGHT-EMITTING DISPLAY APPARATUS AND METHOD OF REPAIRING THE SAME

(75) Inventors: Guang-Hai Jin, Yongin (KR);
Jae-Beom Choi, Yongin (KR);
Kwan-Wook Jung, Yongin (KR);
June-Woo Lee, Yongin (KR);
Seong-Jun Kim, Yongin (KR);
Ga-Young Kim, Yongin (KR)

(73) Assignee: Samsung Display Co., Ltd., Yongin, Gyunggi-Do (KR)

( * ) Notice: Subject to any disclaimer, the term of this patent is extended or adjusted under 35 U.S.C. 154(b) by 173 days.

(21) Appl. No.: 13/589,454

(22) Filed: Aug. 20, 2012

(65) Prior Publication Data

US 2013/0176194 A1 Jul. 11, 2013

(30) Foreign Application Priority Data

Jan. 9, 2012 (KR) .................. 10-2012-0002471

(51) Int. Cl.
*G09G 3/30* (2006.01)
*H01L 21/30* (2006.01)
*H01L 27/32* (2006.01)
*G09G 3/32* (2006.01)

(52) U.S. Cl.
CPC .......... *H01L 27/3276* (2013.01); *G09G 3/3233* (2013.01); *G09G 2300/0852* (2013.01); *G09G 2310/0262* (2013.01); *G09G 2320/0233* (2013.01); *G09G 2330/08* (2013.01); *H01L 2251/568* (2013.01)

(58) Field of Classification Search
USPC .................................. 313/494–512
See application file for complete search history.

(56) References Cited

U.S. PATENT DOCUMENTS

| | | | |
|---|---|---|---|
| 6,327,007 B1 | 12/2001 | Shim | |
| 2001/0028429 A1* | 10/2001 | Wu ................... | 349/139 |
| 2008/0158465 A1* | 7/2008 | Choi et al. ............ | 349/54 |
| 2009/0152552 A1* | 6/2009 | Ku ........................ | 257/59 |
| 2009/0152635 A1* | 6/2009 | Jeong et al. .......... | 257/368 |
| 2009/0262049 A1* | 10/2009 | Yoon et al. ........... | 345/76 |
| 2009/0268116 A1* | 10/2009 | Yagi et al. ............ | 349/39 |
| 2010/0039577 A1* | 2/2010 | Hirato .................. | 349/54 |
| 2010/0044717 A1* | 2/2010 | Choi et al. ............ | 257/72 |
| 2010/0163881 A1* | 7/2010 | Kang et al. ........... | 257/59 |
| 2010/0255620 A1* | 10/2010 | Huh et al. ............. | 438/34 |
| 2010/0273276 A1* | 10/2010 | Lee et al. .............. | 438/4 |
| 2011/0156992 A1* | 6/2011 | Moon et al. .......... | 345/84 |
| 2011/0159622 A1* | 6/2011 | Jeong et al. .......... | 438/34 |

FOREIGN PATENT DOCUMENTS

| | | |
|---|---|---|
| JP | 2003-344874 | 12/2003 |
| KR | 2000-0031532 | 6/2000 |
| KR | 10-2005-0076913 A | 7/2005 |

* cited by examiner

Primary Examiner — Elmito Breval
(74) Attorney, Agent, or Firm — Lee & Morse, P.C.

(57) ABSTRACT

An organic light-emitting display apparatus includes a plurality of pixels, each defined by a scan line, a data line, and a power supply line, a plurality of control lines branching off of one wire in a first direction and simultaneously transferring control signals to the plurality of pixels; and a plurality of repair bridges placed between neighboring ones of the plurality of control lines, each of the plurality of repair bridges including a first bridge connected to one of the neighboring ones of the plurality of control lines and a second bridge connected to another one of the neighboring control lines.

23 Claims, 7 Drawing Sheets

ORGANIC LIGHT-EMITTING DISPLAY APPARATUS AND METHOD OF REPAIRING THE SAME

CROSS-REFERENCE TO RELATED PATENT APPLICATION

This application claims the benefit of Korean Patent Application No. 10-2012-0002471, filed on Jan. 19, 2012, in the Korean Intellectual Property Office, the disclosure of which is incorporated herein in its entirety by reference.

BACKGROUND

1. Field

Embodiments relate to an organic light-emitting display (OLED) apparatus that includes repairable control lines and a method of repairing the OLED.

2. Description of the Related Art

Recently, display apparatuses are being replaced with flat panel display apparatuses that are thin and portable. Among the flat panel display apparatuses, organic light emitting display apparatuses, which are self-emissive display apparatuses that display an image using light emitted by recombination of electrons and holes in an organic emission layer, have a wide viewing angle, excellent contrast, and a high response speed. Thus, organic light emitting display apparatuses are being noticed as next-generation display apparatuses.

Generally, organic light emitting display apparatuses are classified into a passive matrix (PM) type and an active matrix (AM) type according to types of driving organic light-emitting diodes.

SUMMARY

According to an embodiment, there is provided an organic light-emitting display apparatus, including a plurality of pixels, each defined by a scan line, a data line, and a power supply line, a plurality of control lines branching off of one wire in a first direction and simultaneously transferring control signals to the plurality of pixels, and a plurality of repair bridges placed between neighboring ones of the plurality of control lines, the plurality of repair bridges including a first bridge connected to one of the neighboring ones of the plurality of control lines and a second bridge connected to another one of the neighboring control lines.

The plurality of repair bridges may include at least one of the first bridge and the second bridge, which are insulated from one another. The plurality of repair bridges may be arranged at a regular interval relative to a fixed number of the plurality of pixels. The plurality of repair bridges may include at least two pairs of the first bridge and the second bridge to which current is applied. At least one control line of the plurality of control lines may include a portion that is disconnected in the first direction.

The portion of the one control line that is disconnected may be between the at least two pairs of the first bridge and the second bridge to which current is applied. One of the plurality of pixels that is between the at least two pairs of the first bridge and the second bridge, to which current is applied, includes a connection part connected to a control line of a neighboring pixel, one of the connection parts corresponding to the portion of the control line that is disconnected.

One pixel of the plurality of pixels may include at least three thin film transistors (TFTs) and at least two capacitors. One repair bridge of the plurality of repair bridges may be disposed with respect to the pixel such that the first bridge is on a same layer as one gate electrode of the three TFTs. The second bridge may be on a same layer as one of a source and drain electrode of the three TFTs. The control line may be connected to one gate electrode of the three TFTs.

A pixel of the plurality of pixels may include a first electrode, a second electrode, and an organic emission layer disposed between the first electrode and the second electrode.

The first electrode may be a transparent electrode and the second electrode may be a reflective electrode.

The pixel may be connected to a control line of the plurality of control lines, and the first electrode may not overlap with the scan line, the data line, the power supply line or the control line.

At least one control line of the plurality of control lines may be shorted with the scan line extended in a second direction.

At least one control line of the plurality of control lines may be shorted with the data line extended in a second direction.

The power supply line may be a mesh-type power supply line extended in the first direction and the second direction, the second direction being perpendicular to the first direction.

At least one control line of the plurality of control lines may be shorted with the power supply line extended in the second direction.

According to an embodiment, there is provided a method of repairing an organic light-emitting display apparatus, the organic light-emitting display apparatus including a plurality of pixels each defined by a scan line, a data line, and a power supply line, a plurality of control lines branching off of one wire in a first direction and simultaneously transferring control signals to the plurality of pixels, each of the plurality of control lines being connected to transfer control signals to a subset of the plurality of pixels, one of the control lines being a defective control line, a plurality of repair bridges placed between neighboring ones of the plurality of control lines, each of the plurality of repair bridges including a first bridge connected to one of the neighboring ones of the plurality of control lines and a second bridge connected to another one of the neighboring control lines, the method comprising reducing a defective area of the subset of pixels connected to the defective control line by detecting the defective control line among the plurality of control lines, applying current to ones of the plurality of repair bridges located at opposite ends of the defective control line, and cutting a center part between the opposite ends of the defective control line, such that the defective control line is divided into a defective portion and a non-defective portion.

The method of repairing an organic light-emitting display apparatus may further include iteratively repeating the following for a fixed number of times: detecting the defective portion of the defective control line, applying current to ones of the plurality of repair bridges located at opposite ends of the defective portion, and cutting a center part between the opposite ends of the defective portion, such that the defective portion is divided into a reduced defective portion and a non-defective portion.

The method may include disconnecting the defective control line from a pixel in the reduced defective area and connecting the pixel to another control line neighboring the pixel.

The plurality of pixels may each comprise a first electrode, a second electrode facing the first electrode, and an organic emission layer disposed between the first electrode and the second electrode, wherein the detecting of the defective control line includes lighting the organic emission layer.

The applying of current to the repair bridges may be carried out using a laser beam. The cutting of a center of the defective area of the control line may be carried out using a laser beam.

The plurality of repair bridges may be placed at regular intervals relative to a fixed number of the pixels.

The power supply line may include at least one redundant power supply line that is connected to the first power supply line and extends in the second direction perpendicular to the first direction, wherein the defective control line is detected at a portion where the at least one redundant power supply line is shorted with at least one control line of the plurality of control lines.

BRIEF DESCRIPTION OF THE DRAWINGS

Features will become more apparent by describing in detail exemplary embodiments thereof with reference to the attached drawings in which.

DETAILED DESCRIPTION

Hereinafter, the present invention will now be described more fully with reference to the accompanying drawings, in which exemplary embodiments of the inventions are shown. As used herein, the term "and/or" includes any and all combinations of one or more of the associated listed items.

Figure 1:
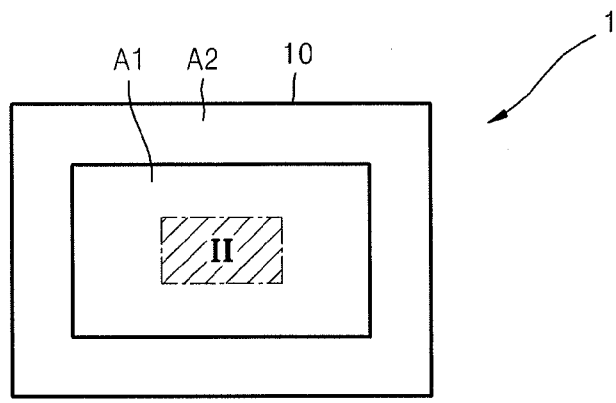
FIG. 1 is a schematic plan view illustrating an organic light-emitting display apparatus according to an embodiment.
Figure 2:
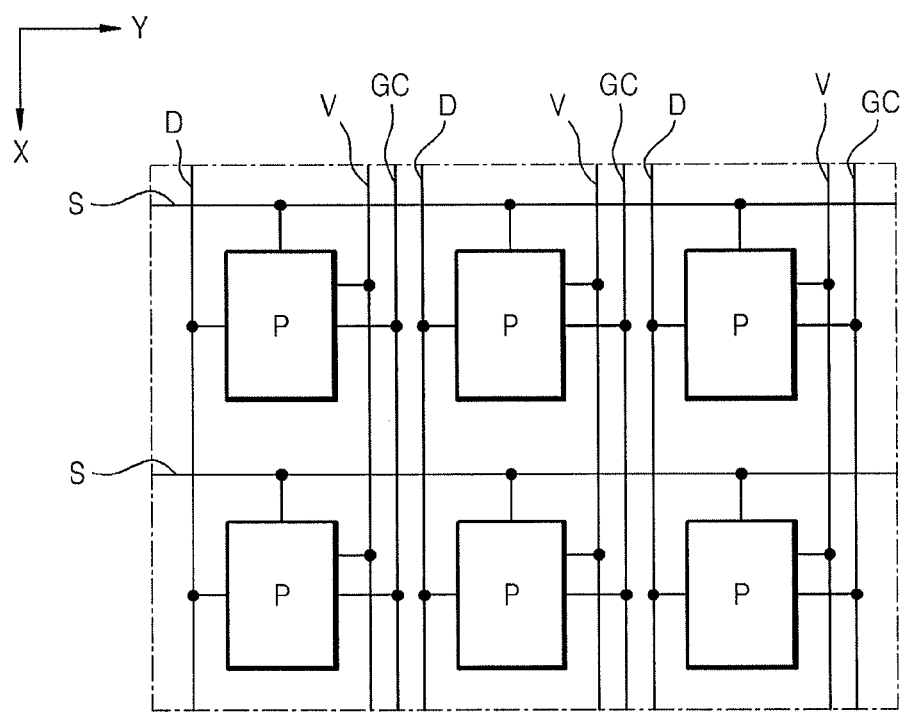
FIG. 2 is a schematic view illustrating wires of region II which is a portion of a display area A1 in FIG. 1.

FIG. 1 is a schematic plan view illustrating an organic light-emitting display apparatus 1 according to an embodiment, and FIG. 2 is a schematic view illustrating wires of region II which is a portion of a display area A1 in FIG. 1.

Referring to FIGS. 1 and 2, the organic light-emitting display apparatus 1 may include the display area A1 displaying an image and a non-display area A2 in a substrate 10. The display area A1 includes a plurality of pixels P in which an image is formed.

Each of the pixels P may be defined by a data line D, which is extended in a first direction X, and a scan line S, which is extended in a second direction Y. The data line D transfers a data signal supplied from a data driving unit (not shown) disposed in the non-display area A2 to each of the pixels P. The scan line transfers a scan signal supplied from a scan driving unit (not shown) disposed in the non-display area A2 to each of the pixels P. Although FIG. 2 illustrates the data line D as extended in the first direction X and the scan line S as extended in the second direction Y, in other implementations, the directions in which the data line D and the scan line S are extended may be switched.

Each of the pixels P is connected to a first power supply line V, which is extended in the first direction X. The first power supply line V supplies a first power ELVDD (see FIG. 3) supplied from a first power supply driving unit (not shown) disposed in the non-display area A2 to each of the pixels P. Although not shown in FIG. 2, each of the pixels P may be supplied with a second power ELVSS (see FIG. 3). Each of the pixels P controls an amount of current supplied from the first power ELVDD via an organic light-emitting diode (OLED) to the second power ELVSS corresponding to the data signal. Then, light of a fixed brightness is generated in the OLED. Although FIG. 2 illustrates the first power supply line V as extended in the first direction X, in other implementations, the first power supply line V may be extended in the second direction Y.

Figure 4:
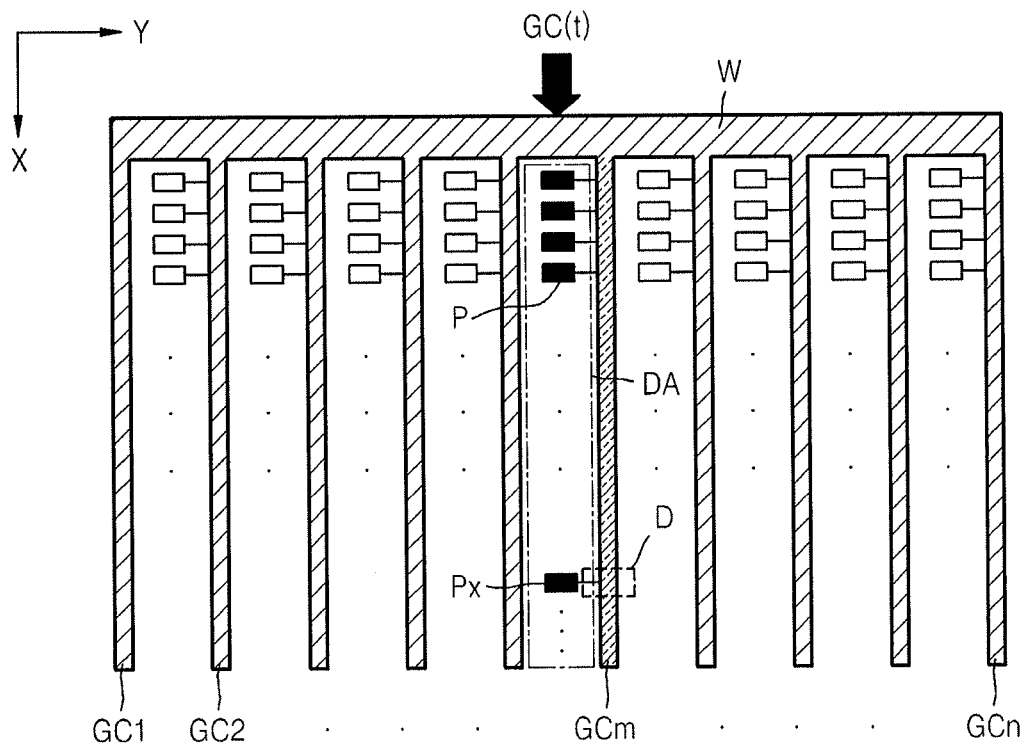
FIG. 4 is a schematic view illustrating a relationship between a control line where a defect occurs and a defective pixel.

Each of the pixels P is connected to a control line GC which is extended in the first direction X by being branched off from one wire W (see FIG. 4). The control line GC simultaneously transfers control signals supplied from a control signal driving unit (not shown) disposed in the non-display area A2 to each of the pixels P at a fixed voltage level.

Figure 3:
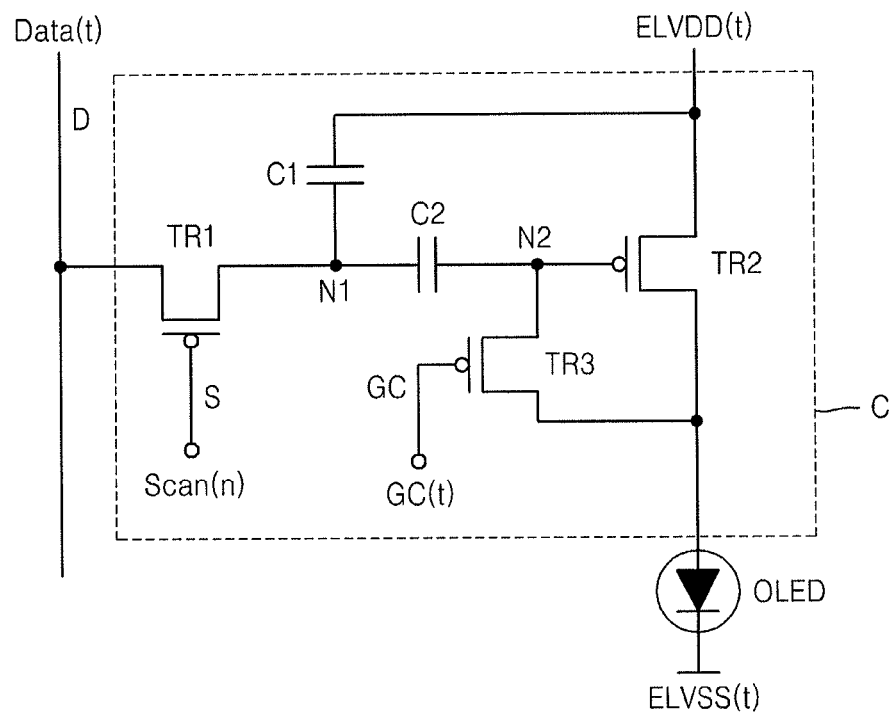
FIG. 3 is a circuit diagram of a pixel of the organic light-emitting display apparatus according to an embodiment.

FIG. 3 is a circuit diagram of a pixel of the organic light-emitting display apparatus according to an embodiment. Referring to FIG. 3, the pixel includes an OLED and a pixel circuit C for supplying current to the OLED.

An anode of the OLED is connected to the pixel circuit C, and a cathode is connected to the second power ELVSS(t). Such an OLED generates light of a fixed brightness corresponding to the current supplied from the pixel circuit C.

An OLED of an active matrix based technology may be formed of two transistors, which are a switching transistor for transferring a data signal and a driving transistor for driving the OLED according to the data signal, and a capacitor for maintaining a data voltage. Such an active matrix organic light-emitting diode (AMOLED) formed of two transistors and one capacitor has a low power consumption. However, an irregular display may occur due to a change in current flowing through the OLED due to a threshold voltage of the driving transistor, the threshold voltage being a difference in voltages of a gate and a source of the driving transistor driving the OLED. Research into a compensating circuitry including a plurality of transistors and a capacitor has been conducted in order to overcome such a problem.

The organic light-emitting display apparatus 1 according to an embodiment may include three transistors TR1 through TR3 and two capacitors C1 and C2 in each of the pixels P.

A gate electrode of a first transistor TR1 is connected to the scan line S, a first electrode is connected to the data line D, and a second electrode is connected to a first node N1. That is, a scan signal Scan(n) is input to the gate electrode of the first transistor TR1, and a data signal Data(t) is input to the first electrode.

A gate electrode of a second transistor TR2 is connected to a second node N2, a first electrode is connected to the first power ELVDD(t), and a second electrode is connected to the anode of the OLED. Here, the second transistor TR2 serves as a driving transistor.

A first capacitor C1 is connected between the first node N1 and the first electrode of the second transistor TR2, which is the first power ELVDD(t), and a second capacitor C2 is connected between the first node N1 and the second node N2.

A gate electrode of a third transistor TR3 is connected to the control line, a first electrode is connected to the gate electrode of the second transistor TR2, and a second electrode is connected to the anode of the OLED, which is the second electrode of the second transistor TR2. Accordingly, the control signal GC(t) is input to the gate electrode of the third transistor TR3, and when the third transistor is turned on, the second transistor TR2 is diode-connected.

According to an embodiment, scan signals are sequentially input with respect to each scan line in a scan/data input section, and data signals are sequentially input to each of the pixels in response to the scan signals, whereas signals having voltage values of previously set levels, i.e. the first power ELVDD(t), the second power ELVSS(t), a scan signal Scan (n), a control signal GC(t), and/or a data signal Data(t), are simultaneously applied to each of the pixels P included in the pixel unit in sections other than the scan/data input section. Operations of compensating for the threshold voltage of the driving transistor included in each of the pixels and emitting each of the pixels are simultaneously performed in all of the pixels included in the pixel unit per frame.

Although FIG. 3 illustrates three transistors and one capacitor included in each pixel, other implementations are possible. That is, if a structure includes a plurality of control lines, which are branched off along the first direction from one wire, signals are simultaneously transferred to all the pixels in order to compensate for the threshold voltage, and a higher number of transistors and/or capacitors than in FIG. 3 may be applied to the structure.

FIG. 4 is a schematic view illustrating a relationship between a control line where a defect occurs and a defective pixel.

As described above, a plurality of the control lines GC1 through GCn extended in the first direction X and branched off from one wire W may be connected to the gate electrode of the third transistor TR3 (see FIG. 3) of each of the pixels P. Thus, the control signals GC(t) may be simultaneously transferred to each of the pixels P at a fixed voltage level.

However, since the plurality of control lines GC1 through GCn are disposed by being branched off from one wire W in the first direction X with a plural number of lines, when a defect occurs in a portion of the control lines GC1 through GCn branched during a manufacturing process, the control signal may not be supplied/transferred to a pixel directly connected to the portion where the defect of the control line occurs or to other pixels connected to the control line where the defect occurs. Therefore, a defect of the wire may generally appear as a line defect rather than a point defect. A line defect may be more serious as a product defect than a point defect.

The defect of the wire in the control line mentioned above may occur for various reasons, but particularly, a defect due to a short between the control line and other wires overlapped with the control line may occur often. For example, referring to FIG. 2 according to an embodiment, a short may be generated between the control line GC extended in the first direction X and the cross-overlapped scan line S extended in the second direction Y. As described above, if the data line D is connected in the second direction Y, a short may be generated between the control line GC and the data line D.

Although not illustrated in FIG. 2, a redundant first power supply line RV (not shown) connected to the first power supply line V in a mesh-type network may be formed in the second direction Y, for example in order to reduce or prevent a voltage drop of the first power supply line V extended in the first direction X. In this regard, the control line GC may be cross-overlapped with the redundant first power supply line RV (not shown). Accordingly, a short may be generated between the control line GC and the redundant first power supply line RV (not shown).

Referring to FIG. 4, the plurality of control lines GC1 through GCn are branched off from one wire W and extended in the first direction X. Each of the plurality of control lines GC1 through GCn is connected to the plurality of pixels P disposed in the first direction X.

When a defective control line GCm is present among the plurality of control lines GC1 through GCn, the control signal is not transferred to the pixel Px directly connected to a defective part D of the defective control line GCm. In addition, the control signal may not be transferred to the other pixels P connected to the defective control line GCm in the first direction. Thus, a defective area DA including the defective pixel may appear as a line defect.

Although FIG. 4 illustrates one control line branched off from one wire connected to one row of pixels, other implementations are possible. If a structure includes a plurality of control lines branched off from one wire, signals to all pixels are simultaneously transferred, and a relationship between the control lines and the pixels may be changed in various ways.

Figure 5:
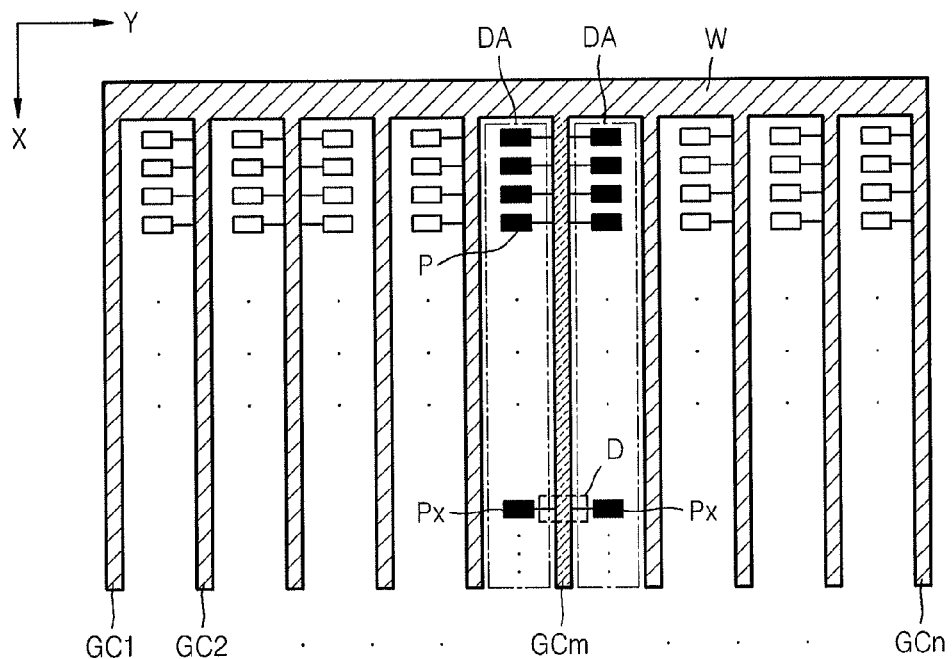
FIGS. 5 and 6 illustrate examples of a transformed relationship between the control lines and the pixels.
Figure 6:
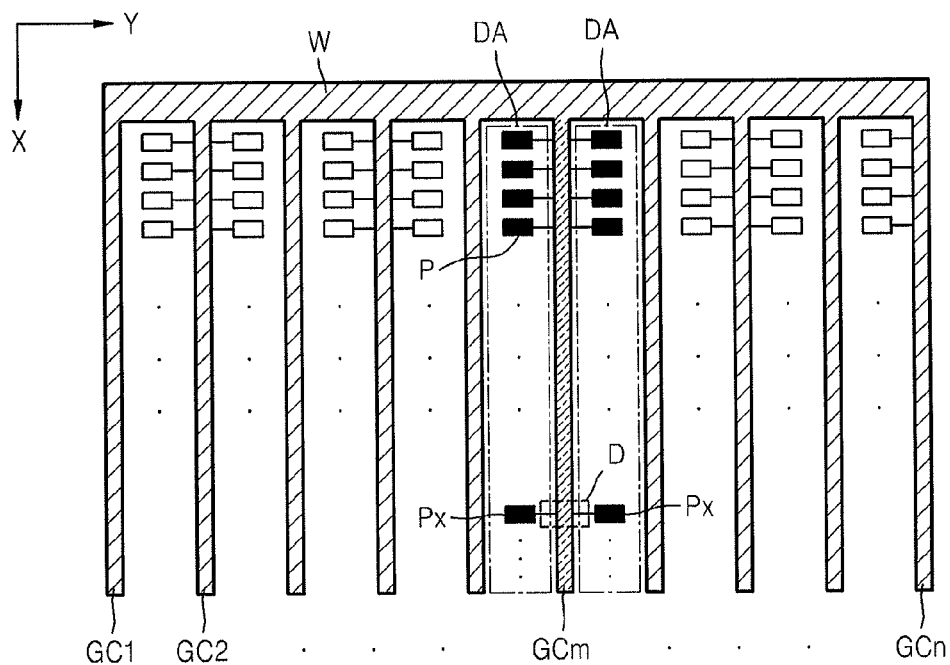

FIGS. 5 and 6 illustrate examples of other possible relationships between the control lines and the pixels.

FIG. 5 illustrates both one control line branched off from one wire connected to one row of pixels and one control line branched off from one wire connected to two rows of pixels. FIG. 6 illustrates that each one of control lines branched off from one wire is connected to two rows of pixels.

In FIGS. 5 and 6, when a defect occurs in the control line GCm connected to two rows of pixels, the control signal is not transferred to the pixel Px directly connected to the defect portion D of the defective control line GCm, and in addition, is not transferred to the other two rows of pixels P connected to the defective control line GCm in the first direction X. Therefore, the defective area DA including the defective pixel is displayed in a double-row, and thus the defective area DA may appear as a line defect that is very distinct.

Figure 7:
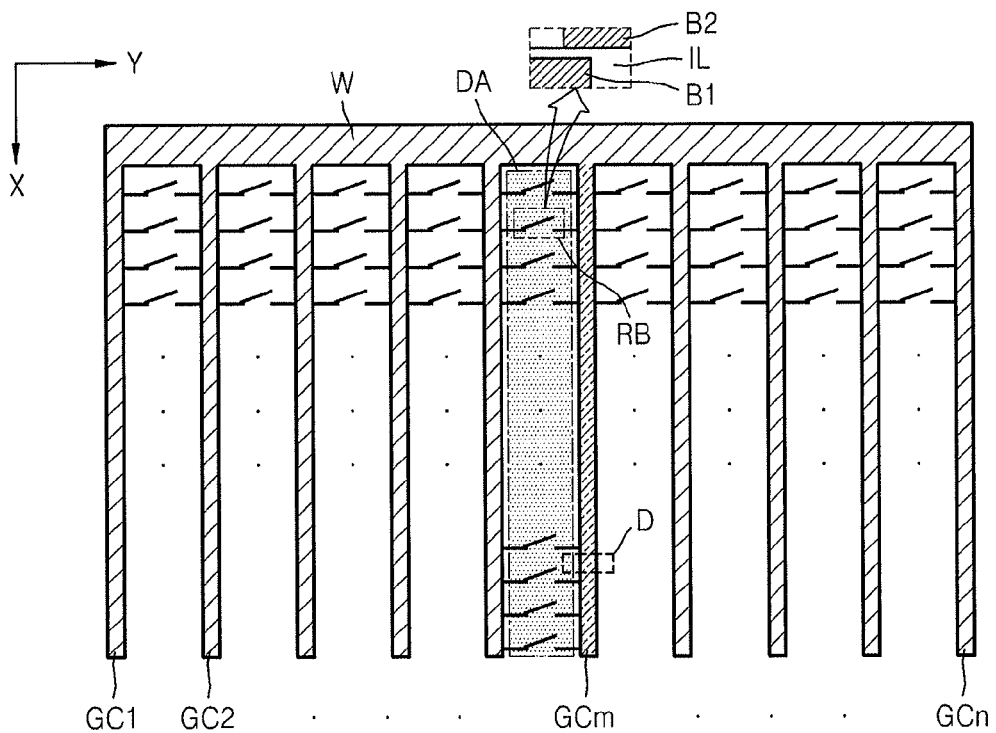
FIG. 7 is a schematic diagram illustrating the control line and a repair bridge of the organic light-emitting display apparatus according to an embodiment.

FIG. 7 is a schematic diagram illustrating the control line and a repair bridge of the organic light-emitting display apparatus according to an embodiment.

Referring to FIG. 7, a plurality of repair bridges RB are included between the plurality of control lines GC1 through GCn branched off from one wire and connected to the plurality of pixels in the first direction X. Each of the repair bridges RB includes a pair of a first bridge B1 and a second bridge B2.

Each pair of the first bridge B1 and the second bridge B2 are insulated with an insulating layer therebetween before a repair process of the defective control line GCm is performed. For example, the first bridge B1 may be formed on the same layer with one of the gate electrode of the thin film transistors TR1 through T3 described above, and the second bridge B2 may be formed on the same layer with one of source and drain electrodes of the thin film transistors (TFTs) TR1 through T3.

The plurality of repair bridges RB may be disposed at regular intervals per a fixed number of pixels. When the repair bridges RB are disposed per each pixel P, a number of repair processes may be increased, a process of manufacturing the repair bridges RB may become complicated, and an aperture ratio may be decreased.

Meanwhile, the defective area DA of the pixels connected to the defective control line GCm in the first direction X as a result of the defective portion D is present as a line defect as explained in relation to FIGS. 4 through 6.

Figure 8A:
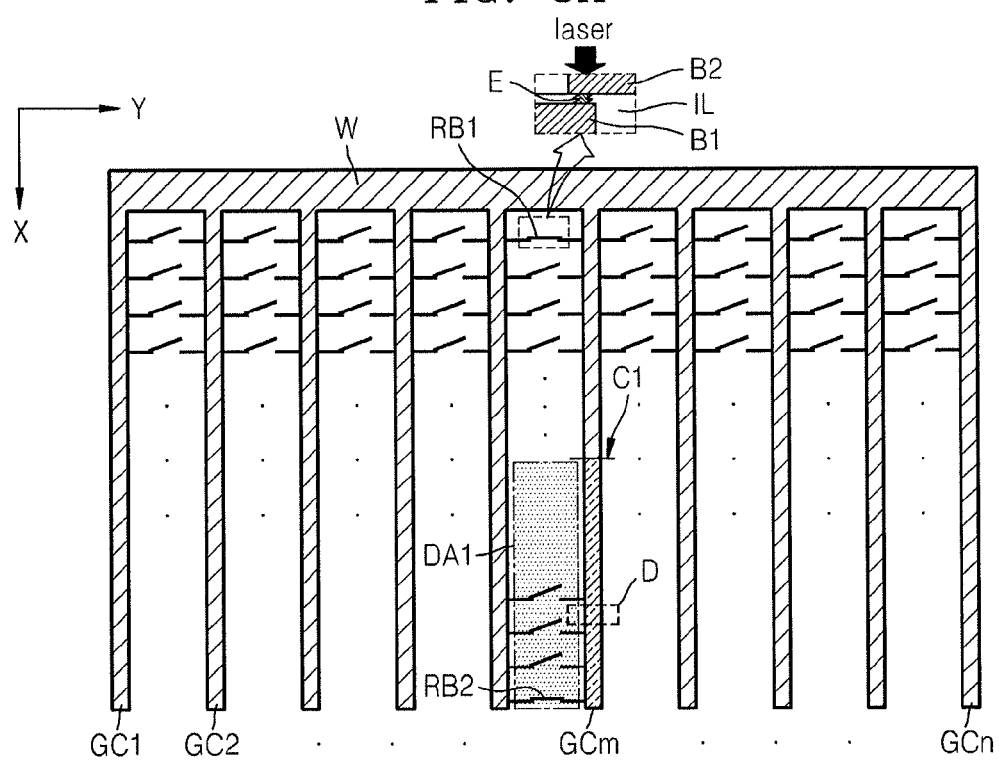
FIGS. 8A through 8C are schematic views illustrating a method of repairing the organic light-emitting display apparatus according to an embodiment.
Figure 8B:
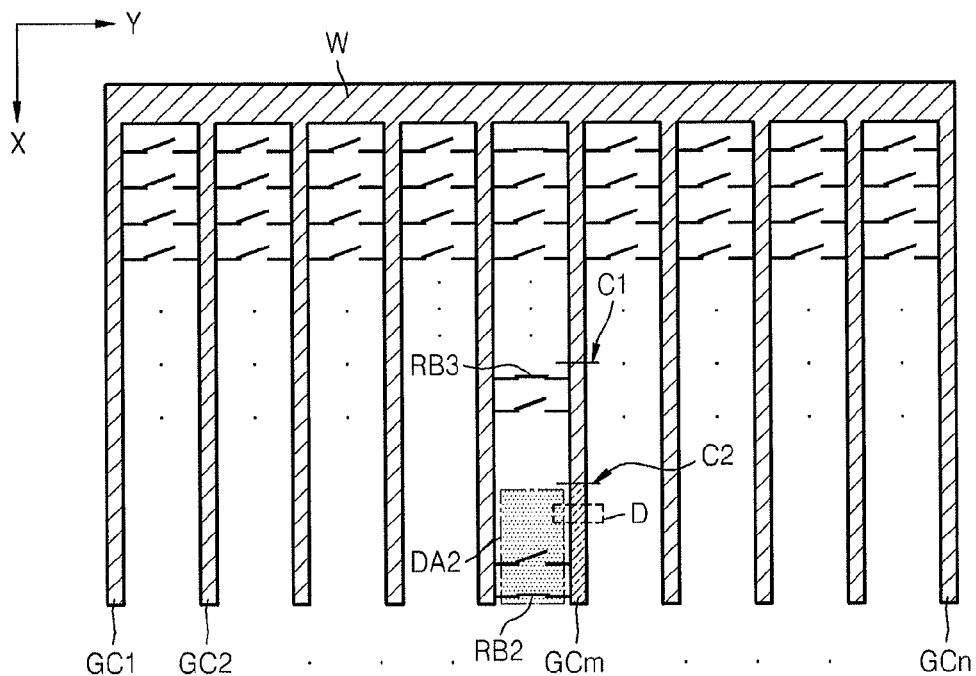
Figure 8C:
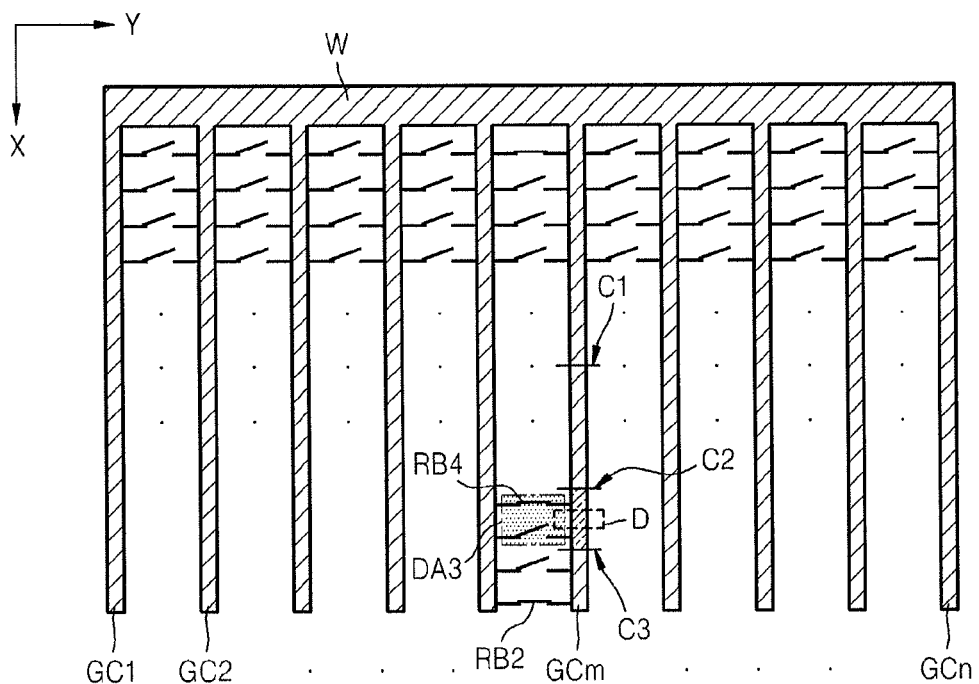

FIGS. 8A through 8C are schematic views illustrating a method of repairing the organic light-emitting display apparatus according to an embodiment.

Referring to FIG. 8A, when the defective control line GCm is detected first, current is applied to the repair bridges RB1 and RB2 placed at both ends of the defective control line GCm, and then a center part C1 between both ends of the defective control line GCm is cut.

If the defective part D of the defective control line GCm is at a lower portion of the defective control line, an upper portion where the defective part D is not included is repaired by the repair bridge RB1 to which current has been applied, and thus a defective area DA1 appears only in the lower portion of the defective control line GCm including the defective part D. Thus, the defective area DA1 is more reduced after one cycle of the repairing process, compared to the defective area DA before a repair process.

As a method of detecting the defective control line GCm, whether pixels are lighted or not may be determined. For example, referring to FIG. 4, while the plurality of pixels P connected to the normal control lines GC1 etc. in the first direction X are normally lighted due to light being emitted from the organic emission layer included in each of the pixels P, the plurality of pixels P connected to the defective control line GCm in the first direction X are not lighted.

A laser beam may be used as a method of applying an electric current to the repair bridges placed at both ends of the defective control line GCm. By melting a portion E of an insulating layer IL between the first bridge B1 and the second bridge B2 with the laser beam, the first bridge B1 and the second bridge B2 may be applied with the current. Also, the laser beam may be used for a method of cutting the center part C1 between both ends of the defective control line GCm.

Referring to FIG. 8B, current is applied to the repair bridges RB2 and RB3 placed at both ends of the defective control line GCm connected to the defective area DA1 which is detected from the one cycle of repairing process, and then a center part C2 between both ends of the defective control line GCm connected to the defective area DA1 is cut. Here, since current has already been applied to the repair bridge RB2, the current is applied to the remaining repair bridge RB3.

An upper portion where the defective part D is not included is repaired by the repair bridge RB3 to which current has been applied, and thus a defective area DA2 appears only in the lower portion of the defective control line GCm including the defective part D. Thus, the defective area DA2 is more reduced after two cycles of repairing process, as compared to the defective area DA1 after one cycle of the repairing process.

Referring to FIG. 8C, current is applied to the repair bridges RB2 and RB4 placed at both ends of the defective control line GCm connected to the defective area DA2 which is detected from the two cycles of repair process, and then a center part C3 between both ends of the defective control line GCm connected to the defective area DA2 is cut. Here, since current has already been applied to the repair bridge RB2, the current is applied to the remaining repair bridge RB4.

A lower portion where the defective part D is not included is repaired by the repair bridge RB2 to which current has been applied, and thus a defective area DA3 is appears only in an upper portion of the defective control line GCm including the defective part D. Thus, the defective area DA3 is more reduced after three cycles of repairing process, as compared to the defective area DA2 after two cycles of the repairing process.

A defective area DAn (not shown) is gradually reduced when the repair process is repeated a fixed number of cycles n, as described above. If each of the repair bridges RB is disposed per each pixel, the final DAn may be reduced into a pixel unit.

In this regard, a number of repair processes may be increased, a process of manufacturing the repair bridges RB may become complicated, and an aperture ratio may be decreased if each of the repair bridges RB is disposed per each pixel. Thus, the repair bridges RB may be disposed in a regular interval per a fixed number of pixels. In this regard, the final defective area DAn includes several pixels, and the defective area DAn may be detected by the fixed number of repair processes.

Figure 9A:
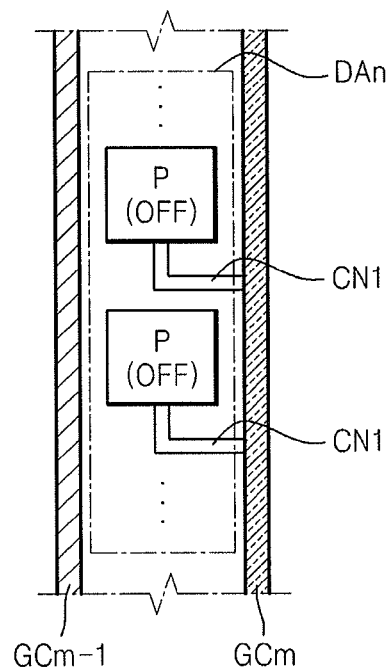
FIGS. 9A and 9B are schematic views illustrating a method of repairing a defective pixel included in a defective area.
Figure 9B:
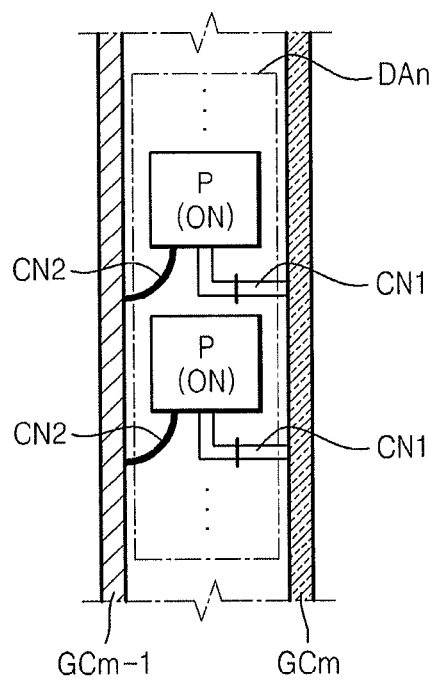

FIGS. 9A and 9B are schematic views illustrating a method of repairing a defective pixel included in a defective area.

Referring to FIG. 9A, the fixed number of defective pixels P included in the final defective area DAn are connected to the defective control line GCm. Control line connection parts CN1 of each of the defective pixels P are each connected to the defective control line GCm, and thus the pixels are off.

Referring to FIG. 9B, the control line connection parts CN1 connected to the defective control line GCm are each disconnected and insulated from the defective control line GCm, and new control line connection parts CN2 of each of the defective pixels P are connected to a normal control line GCm-1 near the defective control line GCm. Therefore, the fixed number of the defective pixels P included in the final defective area DAn are all connected to the normal control line GCm-1, and thus the pixels are on. Therefore, all the pixels connected to the defective control line GCm-1 are repaired.

Figure 10:
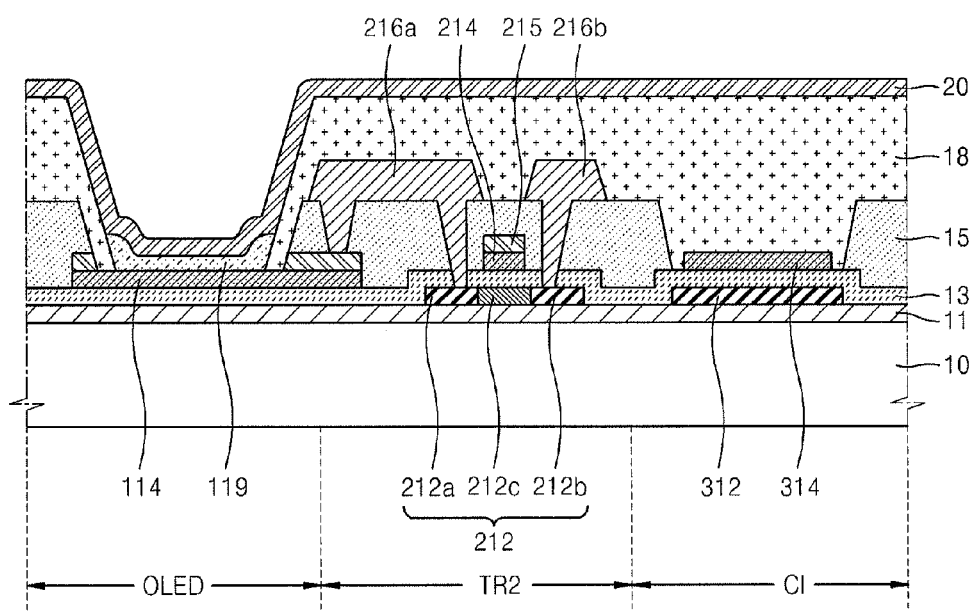
FIG. 10 is a schematic cross-sectional view of some elements of a pixel of the organic light-emitting display apparatus according to an embodiment.

FIG. 10 is a schematic cross-sectional view of some elements of a pixel of the organic light-emitting display apparatus according to an embodiment.

Referring to FIG. 10, the second transistor TR2 which is a driving thin film transistor (TFT), the first capacitor C1, and the OLED are included on the substrate 10. As described above, the first transistor TR1, the third transistor TR3, the second capacitor C2, etc. may be further formed on each of the pixels, and each of the pixels may include many different types of lines such as the scan line S, the data line, the power supply line V, and the control line GC. However, a brief explanation about some of the elements shown in FIG. 10 will be given below.

The substrate 10 may be composed of a transparent glass material such as $SiO_2$. In other implementations, the substrate 10 may be made of other materials, such as a transparent plastic material.

A buffer layer 11 may be further formed on the substrate 10. The buffer layer 11 provides a planar surface to a top portion of the substrate 10 and prevents moisture and impurities from penetrating into the substrate 10.

An active layer 212 of the second transistor TR2 may be formed on the buffer layer. The active layer 212 may be composed of an inorganic semiconductor such as amorphous silicon or poly silicon. Also, the active layer 212 may be composed of an organic semiconductor, an oxide semiconductor, or other various materials. The active layer 212 may include a source area 212B, a drain area 212A, and a channel area 212C.

A gate electrode first layer 214 and a gate electrode second layer 215 including a transparent conductive material may be sequentially formed on a part of the active layer 212 corresponding to the channel area 212C of the active layer 212 with a first insulating layer 13, which is a gate insulating layer, therebetween.

A source electrode 216B and a drain electrode 216A respectively connected to the source area 212B and the drain area 212A of the active layer 212 may be formed with the second insulating layer 15, which is an inter layer dielectric, therebetween on the gate electrode second layer 215.

A third insulating layer 18 may be formed on the second insulating layer 15 to cover the source electrode 216B and the drain electrode 216A. The third insulating layer 18 may be an organic insulating film.

The first transistor TR1 and the third transistor TR3, which are not shown in FIG. 10, may also have the same construction as the second transistor TR2. The control line GC may be connected to the gate electrode of the third transistor TR3. Also, the first bridge B1 and the second bridge B2 of the repair bridge RB described above may be formed respectively on the same layer as the gate electrode of the first through third transistors TR1 through TR3 and the source and drain electrodes.

A pixel electrode first layer 114 composed of the same transparent conductive material as the gate electrode first layer 214 may be formed on the buffer layer 11 and the first insulating layer 13. The transparent conductive material may include at least one or more selected from indium tin oxide (ITO), indium zinc oxide (IZO), zinc oxide (ZnO), indium oxide ($In_2O_3$), indium gallium oxide (IGO), and aluminum zinc oxide (AZO).

An organic emission layer 119 may be formed on the pixel electrode first layer 114, and light emitted from the organic emission layer 119 may be emitted toward the substrate 10 through the pixel electrode first layer 114 composed of the transparent conductive material.

The organic emission layer 119 may be a low molecular weight organic material or a polymer organic material. When the emission layer 119 is formed of the low molecular weight organic material, a hole transport layer (HTL), a hole injection layer (HIL), an electron transport layer (ETL), an electron injection layer (EIL), etc. may be stacked with respect to the organic emission layer 119. Other various layers may be stacked as desired. In this regard, available organic materials include copper phthalocyanine (CuPc), N,N'-di(naphthalene-1-yl)-N,N'-diphenyl-benzidine (NPB), tris-8-hydroxyquinoline aluminum (Alq3), etc.

If the emission layer 119 is formed of the polymer organic material, the emission layer 119 may include a HTL. The HTL may include poly-(3,4)-ethylene-dihydroxy thiophene (PEDOT) or polyaniline (PANI). In this regard, available organic materials include polymer organic materials such as polyphenylene vinylene (PPV) and polyfluorene.

An opposing electrode 20 is stacked on the organic emission layer 119 as a common electrode. In the organic light-emitting display apparatus 1 of the present embodiment, the pixel electrode first layer 114 is used as an anode, and the opposing electrode 20 is used as a cathode, but in other implementations, the polarities of the electrodes may be switched.

The opposing electrode 20 may be a reflective electrode including a reflective material. In this regard, the opposing electrode 20 may include at least one material selected from Al, Mg, Li, Ca, LiF/Ca, and LiF/Al.

The opposing electrode 20 may serve as the reflective electrode. Accordingly, light emitted from the organic emission layer 119 may be reflected from the opposing electrode 20, may be transmitted through the pixel electrode first layer 114 composed of the transparent conductive material, and may be emitted toward the substrate 10.

The organic light-emitting display apparatus 1 of the present embodiment may be a bottom emission type display apparatus in which an image is formed in a direction towards the substrate 10. Accordingly, the pixel electrode first layer 114 may not overlap with the scan line S, the data line D, the power supply line V, and the control line GC. It is to be understood that an organic light-emitting apparatus and pixel structure may vary from what is described herein.

A lower electrode 312 of the first capacitor C1, formed of the same material as the active layer 212 of the second TFT TR2, and an upper electrode 314 of the first capacitor C1, including a transparent conductive material that is the same material as the pixel electrode first layer 114, may be disposed on the substrate 10 and the buffer layer 11. The first insulation layer 13 may be disposed between the lower electrode 312 and the upper electrode 314.

The first insulating layer 13 may be disposed on a top portion of the lower electrode 312 but is not disposed in a boundary of the upper electrode 314. The second insulating layer 15 may be disposed on a top portion of the first insulating layer 13 and may entirely expose the upper electrode 314 so that the upper electrode 314 entirely contacts the third insulating layer 18.

Although not shown in FIG. 10, a sealing member (not shown) may be disposed on a top portion of the opposing electrode 20 in such a way that the sealing member faces one surface of the substrate 10. The sealing member (not shown) may be formed to protect the organic emissive layer 119 from external moisture or oxygen, and may be formed of glass or plastic, or may have a structure in which organic materials and inorganic materials overlap with each other.

By way of summation and review, a plurality of thin film transistors (TFT) and many different wires are formed in an active matrix type organic light-emitting display apparatus, and there is a risk of shorts occurring between the plurality of wires. The shorts between the wires may cause defects in pixels, and the occurrence of defective pixels may lead to a defective product. Therefore, a method to repair the shorted wires is desirable. The embodiments disclosed above relate to an organic light-emitting display apparatus including a repairable control line and a method of repairing the organic light-emitting display apparatus.

According to the embodiments disclosed above, a control line may be repaired by sequentially reducing a defective part of the control line, which appears as a line defect, using repair bridges. A number of repair processes may be minimized by placing the repair bridges at regular pixel intervals.

While the embodiments have been particularly shown and described with reference to exemplary embodiments thereof, it will be understood by those of ordinary skill in the art that various changes in form and details may be made therein without departing from the spirit and scope as defined by the following claims.

What is claimed is:

1. An organic light-emitting display apparatus, comprising:
    a plurality of pixels, each defined by a scan line, a data line, and a power supply line;
    a plurality of control lines branching off of one wire in a first direction and simultaneously transferring control signals to the plurality of pixels; and
    a plurality of repair bridges placed between neighboring ones of the plurality of control lines, the plurality of repair bridges including a first bridge connected to one of the neighboring ones of the plurality of control lines and a second bridge connected to another one of the neighboring control lines.

2. The organic light-emitting display apparatus of claim 1, wherein the plurality of repair bridges include at least one of the first bridge and the second bridge, which are insulated from one another.

3. The organic light-emitting display apparatus of claim 1, wherein the plurality of repair bridges are arranged at a regular interval relative to a fixed number of the plurality of pixels.

4. The organic light-emitting display apparatus of claim 1, wherein the plurality of repair bridges includes at least two pairs of the first bridge and the second bridge to which current is applied.

5. The organic light-emitting display apparatus of claim 4, wherein at least one control line of the plurality of control lines includes a portion that is disconnected in the first direction.

6. The organic light-emitting display apparatus of claim 5, wherein the portion of the one control line that is disconnected is between the at least two pairs of the first bridge and the second bridge to which current is applied.

7. The organic light-emitting display apparatus of claim 6, wherein a pixel between the at least two pairs of the first bridge and the second bridge to which current is applied includes a first connection wire with respect to the control line that is disconnected in the first direction, the first connection wire being in a severed state, and a second connection wire that connects to a neighboring one of the plurality of control lines.

8. The organic light-emitting display apparatus of claim 1, wherein:
one pixel of the plurality of pixels includes at least three thin film transistors (TFTs) and at least two capacitors,
one repair bridge of the plurality of repair bridges is disposed with respect to the pixel such that the first bridge is on a same layer as one gate electrode of the three TFTs, and the second bridge is on a same layer as one of a source and drain electrode of the three TFTs.

9. The organic light-emitting display apparatus of claim 8, wherein the control line is connected to one gate electrode of the three TFTs.

10. The organic light-emitting display apparatus of claim 1, wherein a pixel of the plurality of pixels includes:
a first electrode;
a second electrode; and
an organic emission layer disposed between the first electrode and the second electrode.

11. The organic light-emitting display apparatus of claim 10, wherein the first electrode is a transparent electrode and the second electrode is a reflective electrode.

12. The organic light-emitting display apparatus of claim 10, wherein:
the pixel is connected to a control line of the plurality of control lines, and
the first electrode does not overlap with the scan line, the data line, the power supply line or the control line.

13. The organic light-emitting display apparatus of claim 1, wherein at least one control line of the plurality of control lines is shorted with the scan line extended in a second direction.

14. The organic light-emitting display apparatus of claim 1, wherein at least one control line of the plurality of control lines is shorted with the data line extended in a second direction.

15. The organic light-emitting display apparatus of claim 1, wherein the power supply line is a mesh-type power supply line extended in the first direction and the second direction, the second direction being perpendicular to the first direction.

16. The organic light-emitting display apparatus of claim 15, wherein at least one control line of the plurality of control lines is shorted with the power supply line extended in the second direction.

17. A method of repairing an organic light-emitting display apparatus, the organic light-emitting display apparatus including:
a plurality of pixels each defined by a scan line, a data line, and a power supply line;
a plurality of control lines branching off of one wire in a first direction and simultaneously transferring control signals to the plurality of pixels, each of the plurality of control lines being connected to transfer control signals to a subset of the plurality of pixels, each of the plurality of control lines being connected to transfer control signals to a subset of the plurality of pixels, one of the control lines being a defective control line;
a plurality of repair bridges placed between neighboring ones of the plurality of control lines, each of the plurality of repair bridges including a first bridge connected to one of the neighboring ones of the plurality of control lines and a second bridge connected to another one of the neighboring control lines,
the method comprising reducing a defective area of the subset of pixels connected to the defective control line by:
detecting the defective control line among the plurality of control lines;
applying current to ones of the plurality of repair bridges located at opposite ends of the defective control line; and
cutting a center part between the opposite ends of the defective control line, such that the defective control line is divided into a defective portion and a non-defective portion.

18. The method of repairing an organic light-emitting display apparatus of claim 17, further comprising iteratively repeating the following for a fixed number of times:
detecting the defective portion of the defective control line;
applying current to ones of the plurality of repair bridges located at opposite ends of the defective portion; and
cutting a center part between the opposite ends of the defective portion, such that the defective portion is divided into a reduced defective portion and a non-defective portion.

19. The method of repairing an organic light-emitting display apparatus of claim 17, wherein the plurality of pixels each comprise a first electrode, a second electrode facing the first electrode, and an organic emission layer disposed between the first electrode and the second electrode, wherein the detecting of the defective control line includes lighting the organic emission layer.

20. A method of repairing an organic light-emitting display apparatus of claim 17, wherein the applying of current to the repair bridges is carried out using a laser beam.

21. The method of repairing an organic light-emitting display apparatus of claim 17, wherein the cutting of a center of the defective area of the control line is carried out using a laser beam.

22. The method of repairing an organic light-emitting display apparatus of claim 17, wherein the plurality of repair bridges are placed at regular intervals relative to a fixed number of the pixels.

23. The method of repairing an organic light-emitting display apparatus of claim 17, wherein the power supply line includes at least one redundant power supply line that is connected to the first power supply line and extends in the second direction perpendicular to the first direction, wherein the defective control line is detected at a portion where the at least one redundant power supply line is shorted with at least one control line of the plurality of control lines.

* * * * *

UNITED STATES PATENT AND TRADEMARK OFFICE
CERTIFICATE OF CORRECTION

| | | |
|---|---|---|
| PATENT NO. | : 9,006,967 B2 | Page 1 of 1 |
| APPLICATION NO. | : 13/589454 | |
| DATED | : April 14, 2015 | |
| INVENTOR(S) | : Guang-Hai Jin et al. | |

It is certified that error appears in the above-identified patent and that said Letters Patent is hereby corrected as shown below:

On the title page, under abstract "23 Claims, 7 Drawing Sheets" should read -- 24 Claims, 7 Drawing Sheets --.

In the Claims

Column 12, line 62, Please insert

-- 24. The method of repairing an organic light-emitting display apparatus of claim 18, wherein the method includes disconnecting the defective control line from a pixel in the reduced defective area and connecting the pixel to another control line neighboring the pixel. --

Signed and Sealed this
Fifteenth Day of December, 2015

Michelle K. Lee
*Director of the United States Patent and Trademark Office*